United States Patent
Lim et al.

(10) Patent No.: US 9,870,833 B2
(45) Date of Patent: Jan. 16, 2018

(54) NONVOLATILE MEMORY DEVICE INCLUDING PAGE BUFFER AND METHOD FOR VERIFYING PROGRAM OPERATION THEREOF

(71) Applicant: SAMSUNG ELECTRONICS CO., LTD., Suwon-Si, Gyeonggi-Do (KR)

(72) Inventors: Bongsoon Lim, Seoul (KR); Seokmin Yoon, Seoul (KR); Sang-Won Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/425,557

(22) Filed: Feb. 6, 2017

(65) Prior Publication Data

US 2017/0278580 A1 Sep. 28, 2017

(30) Foreign Application Priority Data

Mar. 23, 2016 (KR) ........................ 10-2016-0034795

(51) Int. Cl.
| | | |
|---|---|---|
| *G11C 16/04* | (2006.01) | |
| *G11C 16/34* | (2006.01) | |
| *G11C 16/26* | (2006.01) | |
| *G11C 16/10* | (2006.01) | |
| *G11C 16/08* | (2006.01) | |
| *G06F 11/20* | (2006.01) | |

(52) U.S. Cl.
CPC ...... *G11C 16/3459* (2013.01); *G06F 11/2094* (2013.01); *G11C 16/08* (2013.01); *G11C 16/10* (2013.01); *G11C 16/26* (2013.01)

(58) Field of Classification Search
CPC ..... G11C 16/3459; G11C 16/08; G11C 16/10; G06F 11/2094
USPC ............. 365/185.22, 185.17, 185.05, 185.03
See application file for complete search history.

(56) References Cited

U.S. PATENT DOCUMENTS

| | | | |
|---|---|---|---|
| 7,023,741 B2 | 4/2006 | Nakamura et al. | |
| 7,180,783 B2 | 2/2007 | Kim et al. | |
| 7,200,044 B2 * | 4/2007 | Won ....................... | G11C 16/08 365/185.03 |
| 7,242,615 B2 | 7/2007 | Nagashima | |

(Continued)

FOREIGN PATENT DOCUMENTS

| | | |
|---|---|---|
| KR | 1020020047772 A | 6/2002 |
| KR | 100401515 B1 | 9/2003 |

(Continued)

*Primary Examiner* — Vu Le
(74) *Attorney, Agent, or Firm* — Volentine & Whitt, PLLC

(57) ABSTRACT

A nonvolatile memory device may include a cell array, a first page buffer, and a second page buffer. The first page buffer may be connected to a first memory cell of the cell array and may store first sensing data generated by sensing whether a program operation of the first memory cell is completed during a program verify operation. The second page buffer may be connected to a second memory cell of the cell array. During the program verify operation, the second page buffer may generate and store first verify data based on second sensing data generated by sensing whether a program operation of the second memory cell is completed, may receive the first sensing data from the first page buffer, and may store second verify data generated by accumulating the first sensing data and the first verify data.

20 Claims, 14 Drawing Sheets

(56) References Cited

U.S. PATENT DOCUMENTS

| | | | |
|---|---|---|---|
| 7,679,133 B2 | 3/2010 | Son et al. | |
| 7,889,592 B2 | 2/2011 | Kim | |
| 8,526,238 B2 | 9/2013 | Moschiano et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,923,056 B2 | 12/2014 | Kim | |
| 2007/0297228 A1* | 12/2007 | Song | G11C 11/5628 365/185.08 |
| 2010/0315879 A1* | 12/2010 | Huh | G11C 11/5628 365/185.22 |
| 2011/0233648 A1 | 9/2011 | Seol et al. | |
| 2014/0153329 A1* | 6/2014 | Kang | G11C 7/1039 365/185.03 |

FOREIGN PATENT DOCUMENTS

| | | |
|---|---|---|
| KR | 10-0518288 B1 | 9/2005 |
| KR | 10-0528483 B1 | 11/2005 |
| KR | 1020080076022 A | 8/2008 |
| KR | 101034447 B1 | 5/2011 |
| KR | 1020130037059 A | 4/2013 |
| KR | 10-1321472 B1 | 10/2013 |
| KR | 1020140079912 A | 6/2014 |

\* cited by examiner

NONVOLATILE MEMORY DEVICE INCLUDING PAGE BUFFER AND METHOD FOR VERIFYING PROGRAM OPERATION THEREOF

CROSS-REFERENCE TO RELATED APPLICATIONS

This US non-provisional patent application claims priority under 35 USC §119 to Korean Patent Application No. 10-2016-0034795, filed on Mar. 23, 2016, the entirety of which is hereby incorporated by reference.

BACKGROUND

The present disclosure relates to semiconductor memory devices and, more particularly, to a nonvolatile memory device including a page buffer and a method for verifying a program operation of the nonvolatile memory device.

A semiconductor memory device is a device that stores data according to the control of a host device such as a computer, a smartphone, and a smart pad. A semiconductor memory device includes a device that stores data in a memory device such as a solid state drive (SSD) and a memory card, particularly a nonvolatile memory device.

Nonvolatile memory devices include a read-only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

With the advance in semiconductor manufacturing technology, high capacity of nonvolatile memory devices is increasingly required. High capacity of a nonvolatile memory device may be achieved by increasing the number of memory cells of the nonvolatile memory device or increasing the number of bits stored in a single memory cell of the nonvolatile memory device. In particular, when the number of bits stored in a single memory cell increases, storage capacity of semiconductor memories of the same size increases in multiple. However, a memory cell storing multiple bits has a higher failure rate during a manufacturing process than a memory cell storing a single bit.

SUMMARY

Embodiments of disclosure provide a nonvolatile memory device that internally processes and outputs data of a memory cell during a program verify operation and a program verify method of the nonvolatile memory device.

A nonvolatile memory device according to example embodiments of disclosure may include a cell array, a first page buffer, and a second page buffer. The first page buffer may be connected to a first memory cell of the cell array and may store first sensing data generated by sensing whether a program operation of the first memory cell is completed during a program verify operation. The second page buffer may be connected to a second memory cell of the cell array. During the program verify operation, the second page buffer may generate and store first verify data based on second sensing data generated by sensing whether a program operation of the second memory cell is completed, may receive the first sensing data from the first page buffer, and may store second verify data generated by accumulating the first sensing data and the first verify data.

A program verify operation of a nonvolatile memory according to example embodiments of disclosure may include storing first and second sensing data sensed from different memory cells in first and second page buffers according to a program verify operation, respectively, generating first verify data from the first sensing data in the first page buffer, transmitting the second sensing data from the second page buffer to the first page buffer, and generating second verify data in the first page buffer by accumulating the transmitted second sensing data and the first verify data.

According to example embodiments of disclosure, a method executed by a page buffer circuit of a nonvolatile memory device (NVM) may detect errors within memory cells of the NVM read by the page buffer circuit during a single program verify operation. The method may include executing a first binary logic operation between: (1) a first data value sensed from a first memory cell by a first page buffer of the page buffer circuit during the program verify operation and (2) a second data value sensed from a second memory cell by a second page buffer of the page buffer circuit during the program verify operation. The number of program errors existing among the first and second memory cells is determined based upon the outcome of the first binary logic operation and the second data value.

DETAILED DESCRIPTION

Below, example embodiments of the disclosure will now be described more fully so that those skilled in the art can easily comprehend the disclosure.

Figure 1:
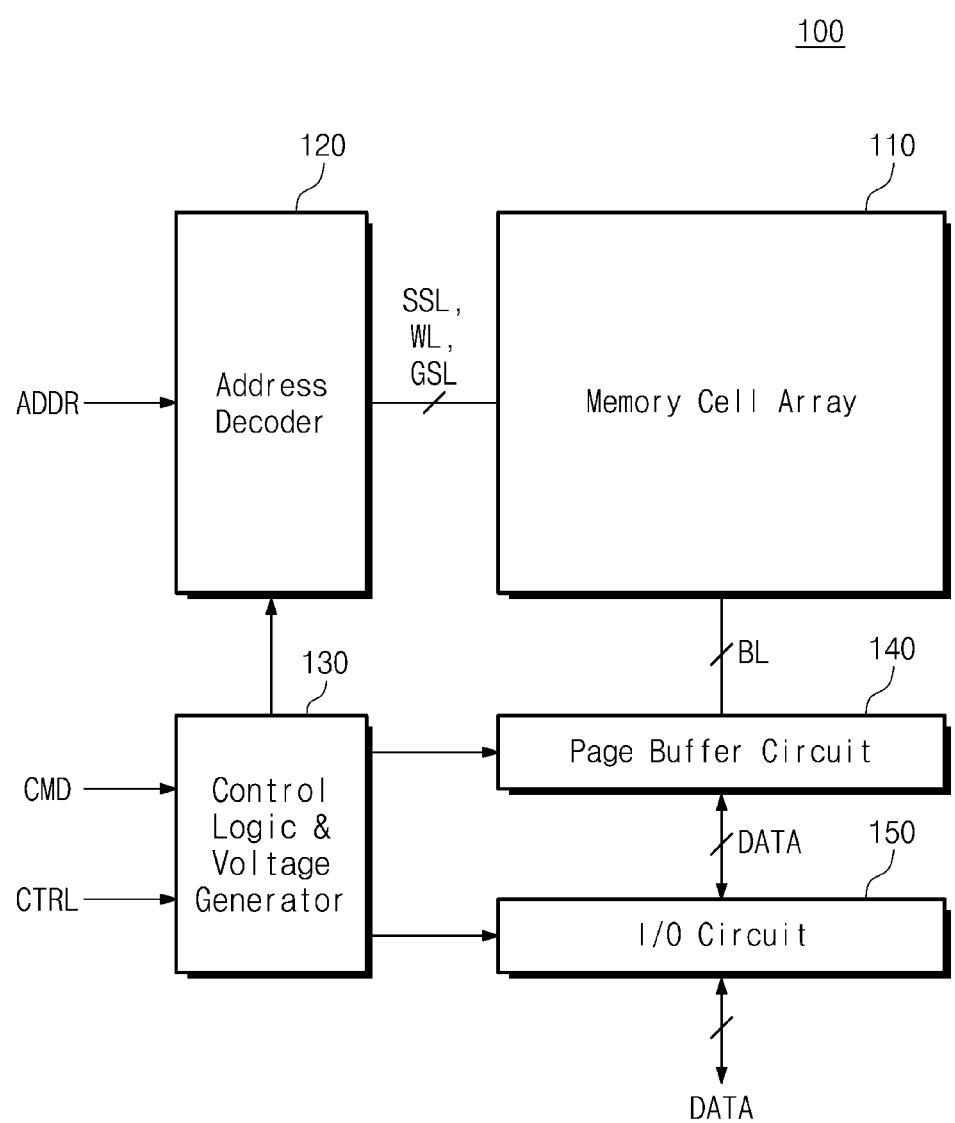
FIG. 1 is a block diagram of a nonvolatile memory device according to example embodiments of the disclosure.

FIG. 1 is a block diagram of a nonvolatile memory device 100 according to example embodiments of the disclosure. As illustrated, the nonvolatile memory device 100 may include a memory cell array 110, an address decoder 120, a control logic and voltage generator 130, a page buffer circuit 140, and an input/output (I/O) circuit 150.

The memory cell array 110 may include a plurality of memory blocks. Memory cells MC of each of the memory blocks may form a two-dimensional structure. In addition, the memory cells MC of each of the memory blocks may be vertically stacked on a substrate to form a three-dimensional structure. Each of the memory blocks may include a plurality of cell strings, and each of the cell strings may include a plurality of memory cells MC. The plurality of memory cells MC may be connected to a plurality of wordlines WL, respectively. Each of the memory cells MC may be provided as a single-level cell (SLC) storing one bit of data or a multi-level cell (MLC) storing at least two bits of data. For example, a plurality of memory blocks may include a plurality of sub-blocks. In addition, a plurality of memory blocks may include a plurality of pages.

In example embodiments of the disclosure, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of the disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The address decoder 120 may be connected to the memory cell array 110 through a plurality of wordlines WL, a string selection line SSL, and a ground selection line GSL. The address decoder 120 may receive an address ADDR from an external device (e.g., a memory controller, a host, an application processor (AP) or the like) and decode the received address ADDR to select at least one of the wordlines WL. The address decoder 120 may control a voltage of each of the wordlines WL to perform a read or write operation on the selected wordline WL.

The control logic and voltage generator 130 may receive a command CMD and a control signal CTRL from the external device and control the address decoder 120, the page buffer circuit 140, and the I/O circuit 150 in response to received signals. For example, the control logic and voltage generator 130 may control the address decoder 120, the page buffer circuit 140, and the I/O circuit 150 such that data DATA is written into the memory cell array 110 in response to the command CMD and the control signal CTRL. Alternatively, the control logic and voltage generator 130 may control the address decoder 120, the page buffer circuit 140, and the I/O circuit 150 such that data DATA stored in the memory cell array 110 is output in response to the command CMD and the control signal CTRL. Alternatively, the control logic and voltage generator 130 may control the address decoder 120, the page buffer circuit 140, and the I/O circuit 150 such that a portion of the memory cell array 110 is erased in response to the command CMD and the control signal CTRL.

The control logic and voltage generator 130 may generate various voltages required to operate the nonvolatile memory device 100. For example, the control logic and voltage generator 130 may generate various voltages such as a plurality of read voltages, a plurality of verify voltages, a plurality of program voltages, a plurality of pass voltages, and a plurality of erase voltages and provide the generated voltages to the address decoder 120.

The page buffer circuit 140 may be connected to the memory cell array 110 via a plurality of bitlines BL. The page buffer circuit 140 may temporarily store data DATA read from the memory cell array 110 and may temporarily store data DATA to be written into the memory cell array 110. For example, the page buffer circuit 140 may include a plurality of latch circuits. The latch circuits may temporarily store data DATA. The configuration of the page buffer circuit 140 will be described later with reference to FIG. 2.

The I/O circuit 150 may receive data DATA from an external device according to the control of the control logic and voltage generator 130 and transmit the received data DATA to the page buffer circuit 140. Alternatively, the I/O circuit 150 may transmit data DATA received from the page buffer circuit 140 to an external device according to the control of the control logic and voltage generator 130.

For example, data DATA to be programmed into the memory cell array 110 may be temporarily stored in the page buffer circuit 140 during a program operation of the nonvolatile memory device 100. The nonvolatile memory device 100 may execute a plurality of program loops to program the data DATA stored in the page buffer circuit 140 into the memory cell array 110. Each of the program loops may include a program step to apply a program pulse and a verify step to apply a verify voltage.

For example, the nonvolatile memory device 100 may decide a program state (or a threshold voltage distribution) of a plurality of memory cells MC based on the data DATA stored in the page buffer circuit 140. For example, the nonvolatile memory device 100 may decide a target program state (or a target threshold voltage distribution) of a plurality of memory cells MC according to predetermined bit ordering. The nonvolatile memory device 100 may execute a plurality of program loops such that each of the memory cells MC has a target program state.

For example, the nonvolatile memory device 100 may detect whether memory cells of a specific reference unit fail based on the data DATA stored in the page buffer circuit 140. For example, the reference unit may be equal to the number of input/output pads of the I/O circuit 150. That is, when the I/O circuit 150 exchanges data with an external entity via 10 input/output pads, the above-mentioned reference unit may be a unit of 10. The page buffer circuit 140 accumulates and outputs whether a connected memory cell MC fails. Thus, the page buffer circuit 140 may reduce program verify time of the memory cell array 110. The configuration and operation of the page buffer circuit 140 will be described below in detail.

Figure 2:
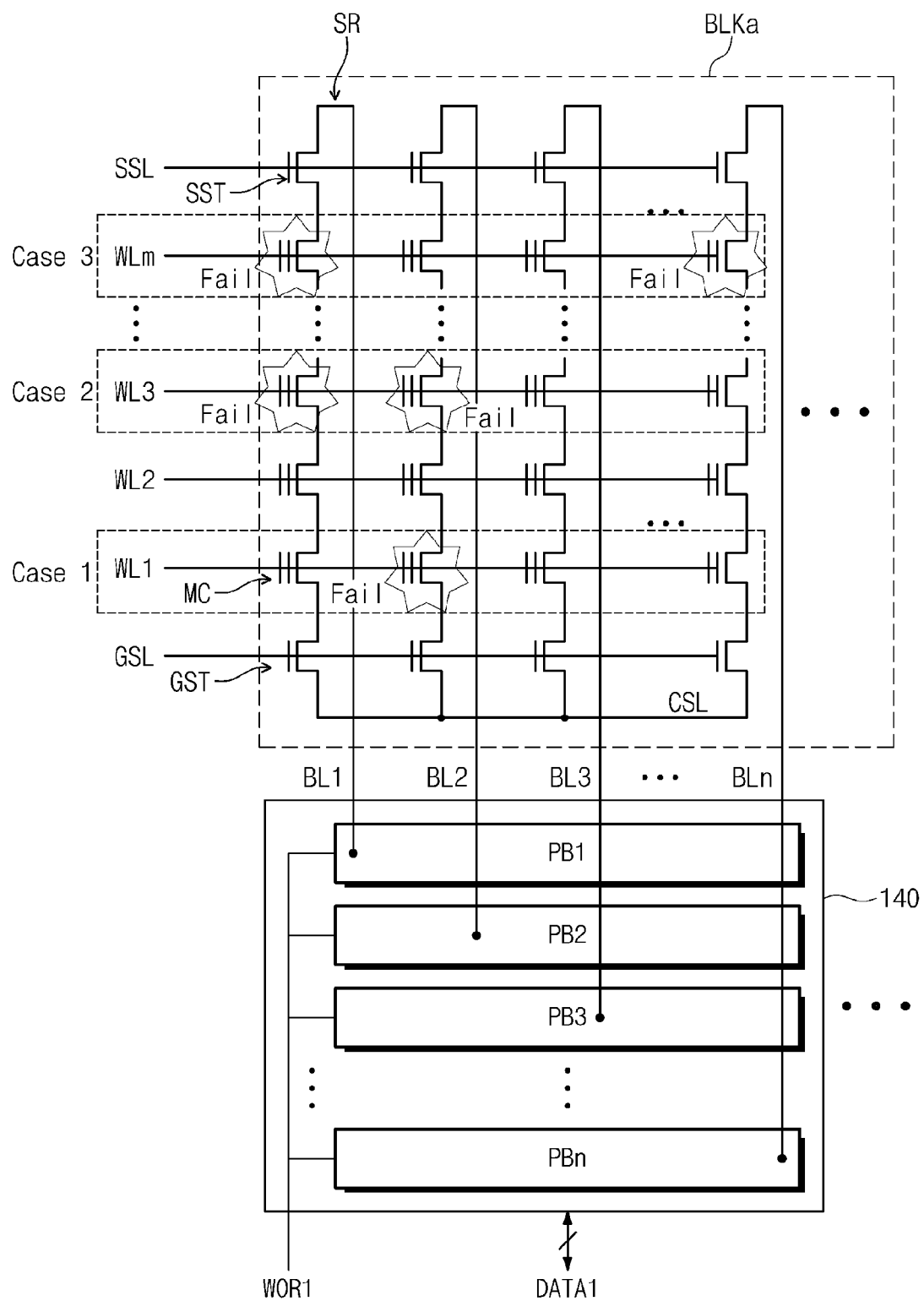
FIG. 2 is a circuit diagram of a page buffer circuit in FIG. 1.

FIG. 2 is a circuit diagram of the page buffer circuit 140 in FIG. 1. The page buffer circuit 140 may be connected to an individual block. Hereinafter, the configuration and the operation of a single block BLKa among the memory blocks will be described first to describe connection of the page buffer circuit 140.

The memory block BLKa may include a plurality of strings SR. The plurality of strings SR may be connected to a plurality of bitlines BL1 to BLn, respectively. Each of the strings SR may include a ground selection transistor GST, memory cells MC, and a string selection transistor SST. Alternatively, although not shown in the drawing, when the memory cell array 110 has a three-dimensional structure, each bitline BL may be connected to a plurality of strings SR connected to different string selection lines SSL. The ground selection transistors GST are controlled by a ground selection line GSL, and the string selection transistors SST are controlled by a string selection line SSL.

A ground selection transistor GST of each of the strings SR may be coupled between the memory cells MC and a common source line CSL. Ground selection transistors GST of the strings SR may be commonly connected to the common source line CSL.

A string selection transistor SST of each of the strings SR may be coupled between the memory cells MC and a bitline BL. The string selection transistors SST of the strings SR may be connected to the bitlines BL1 to BLn, respectively.

In each of the strings SR, a plurality of memory cells MC is provided between a ground selection transistor GST and a string selection transistor SST. In each of the strings SR, a plurality of memory cells MC may be connected in series.

In each of the strings SR, memory cells MC disposed at the same row may be commonly connected to a single wordline. Memory cells MC of the strings SR may be connected to a plurality of wordlines WL1 to WLm.

A program operation and a read operation of the memory cells MC may be performed in units of wordlines WL. Memory cells MC commonly connected to a single wordline WL may be programmed or read simultaneously, which may be defined as a single page. An erase operation of the memory cells MC may be performed in units of memory blocks. Memory cells MC of a single block may be erased simultaneously. For example, an erase operation of the memory cells MC may be performed in units of sub-blocks. For example, an erase operation of the memory cells MC may be performed to simultaneously erase memory cells MC of a single sub-block.

As shown in FIG. 2, the page buffer circuit 140 is connected to the memory block BLKa in a reference unit divided into n bitlines. For example, in the memory block BLKa, n memory cells MC connected to a first wordline WL1 may constitute a single reference unit. As mentioned above, the reference unit may be equal to the number of the input/output pads of the I/O circuit 150. In this case, the memory block BLKa may include a plurality of groups of first to n bitlines BL1 to BLn divided into a single reference unit. The page buffer circuit 140 may be divided into reference units to be connected to the memory block BLKa. Accordingly, when the single memory block BLKa is divided into ten reference units, the memory block BLKa may be connected to ten page-buffer circuits 140 divided into the reference units.

Hereinafter, the configuration and operation of the page buffer circuit 140 will now be described. The page buffer circuit 140 may include a plurality of page buffers PB1 to PBn.

The page buffers PB1 to PBn may be connected to the bitlines BL1 to BLn, respectively. For example, each of the page buffers PB1 to PBn may temporarily store data DATA read from the memory cell array 110 or may temporarily store data DATA to be written into the memory cell array 110. For example, each of the page buffers PB1 to PBn may include a plurality of latches. The latches may temporarily store data DATA.

During a program operation, each of the page buffers PB1 to PBn verifies whether a program operation of a selected memory cell MC among memory cells MC of a connected cell string SR is completed. The page buffers PB1 to PBn may verify a failure of a cell string in a reference unit through a verify operation.

A failure may be defined as a case where data other than that programmed is output. For example, in a case where data output from a selected memory cell MC is logic '0' after logic '1' is previously stored in the memory cell MC, the case is a failed state. The configuration and operation of the page buffers PB1 to PBn will be described later with reference to FIGS. 4 to 6 and FIG. 8.

FIG. 2 shows three types of failure of a cell string SR that may be detected by the above-described program verify operation.

For example, a failure may occur in a memory cell MC connected to a first wordline WL1 (Case 1). Alternatively, a failure may occur successively in two adjacent memory cells MC among memory cells MC connected to a third wordline WL3 (Case 2). Alternatively, a failure may occur in two discontinuous (e.g., non-adjacent) memory cells connected to an $m^{th}$ wordline WLm (Case 3). The above three types of failure are merely exemplary and various types of failure may occur. For example, a failure made by a combination of Case 2 and Case 3 may occur or a failure may occur in two or more memory cells MC. The page buffer circuit 140 may detect the above failure types in reference units.

So far, the configuration of the page buffer circuit 140 has been described. Now, the operation of the page buffer circuit 140 will be described below with reference to FIG. 3.

Figure 3:
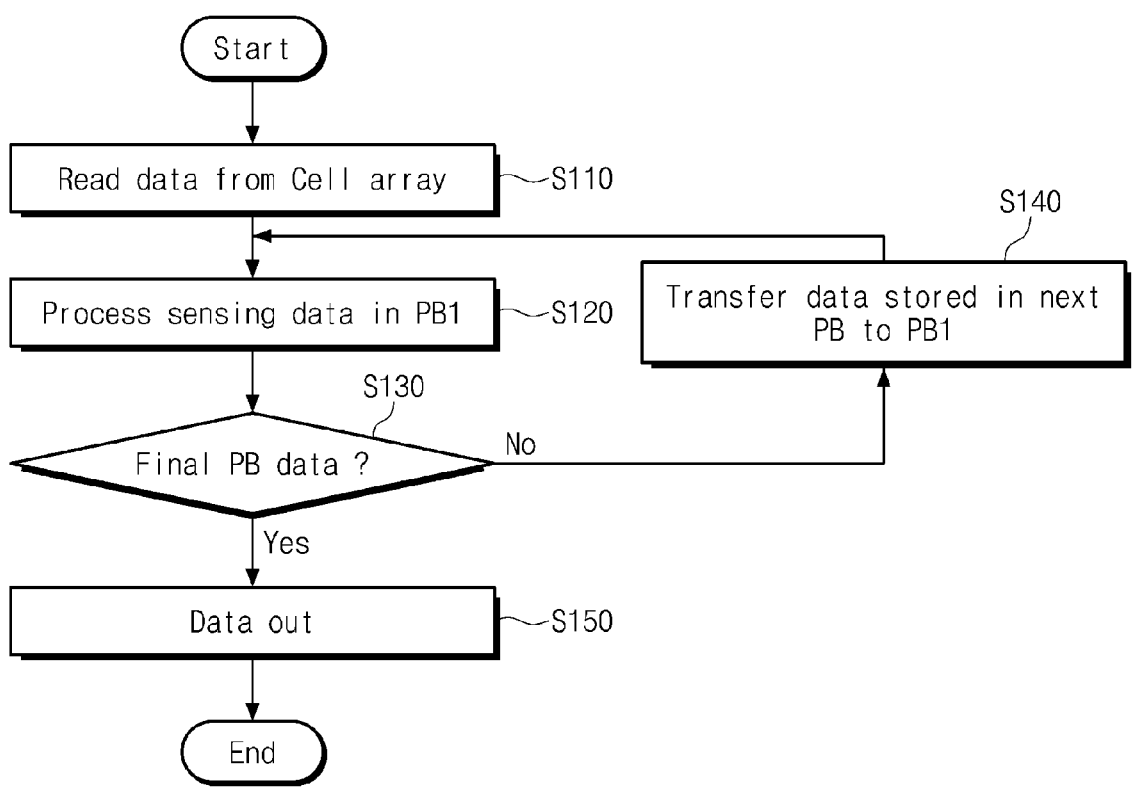
FIG. 3 is a flowchart summarizing a program verify method according to example embodiments of the disclosure.

FIG. 3 is a flowchart summarizing a program verify method according to example embodiments of disclosure. Referring to FIG. 3, the page buffer circuit 140 may accumulate data on whether reference units fail and output the accumulated data as one item of data. FIG. 3 will be described with reference to FIG. 2.

In S110, the page buffer circuit 140 reads programmed data from the memory block BLKa in reference units. For example, each of the page buffers PB1 to PBn of the page buffer circuit 140 reads data of the memory cell MC connected to the first wordline WL1 and senses the read data in a sensing latch SL of each of the page buffers PB1 to PBn to generate sensing data.

For example, data stored in the cell array 110 may be a regular pattern including a plurality of logic '1' or '0'. Alternatively, data stored in the cell array 110 may be a pattern in which logic '1' and '0' are repeated. Alternatively, data stored in the cell array 110 may include various patterns. It will be assumed, for the purpose of explanation, that data of logic '1' is programmed into the entire memory cell array 110. Accordingly, a case where logic '1' is read from the memory cell MC is "PASS" while a case where logic '0' is read from the memory cell MC is "FAILURE".

In S120, the first page buffer PB1 processes data to detect whether a memory cell MC fails. First, the first page buffer PB1 processes data to detect a failure of a memory cell MC connected to a first wordline WL1 and a first bitline BL1. Then the first page buffer PB1 processes the sensing data transmitted from the next page buffer in S140, which is aimed to detect a failure of a memory cell MC connected to the first wordline WL1 and a second bitline BL2. S120 will be described later in detail with reference to FIGS. 4 to 7.

In S130, the first page buffer PB1 determines whether the processed data is sensing data of the last page buffer. Returning to FIG. 2, the last page buffer of the page buffer circuit 140 may be an $n^{th}$ page buffer PBn. When the processed data is not the sensing data of the last page buffer (the "No" outcome in FIG. 3), the flow proceeds to S140. When the processed data is the sensing data of the last page buffer (the "Yes" outcome in FIG. 3), the flow proceeds to S150.

In S140, the next page buffer provides the sensed data to the first page buffer PB1. That is, the first page buffer PB1 sequentially receives and accumulates sensed data of the second to $n^{th}$ page buffers PB2 to PBn to process the data (S120). As a result, the data processed in the first page buffer PB1 is information including accumulated data on whether a plurality of memory cells MC connected to the first wordline WL1 fail.

In S150, the first page buffer PB1 outputs the processed data. Thus, the nonvolatile memory device 100 may provide information indicating whether a memory cell MC fails in reference units instead of outputting and processing data of all memory cells MC.

Then the page buffer circuit 140 may sequentially read data of a plurality of memory cells MC connected to the second to $m^{th}$ wordlines WL2 to WLm and repeatedly perform S110 to S150 on each of the memory cells MC of each of the wordlines WL2 to WLm so as to perform a program verify operation of the memory cell array 110.

Figure 4:
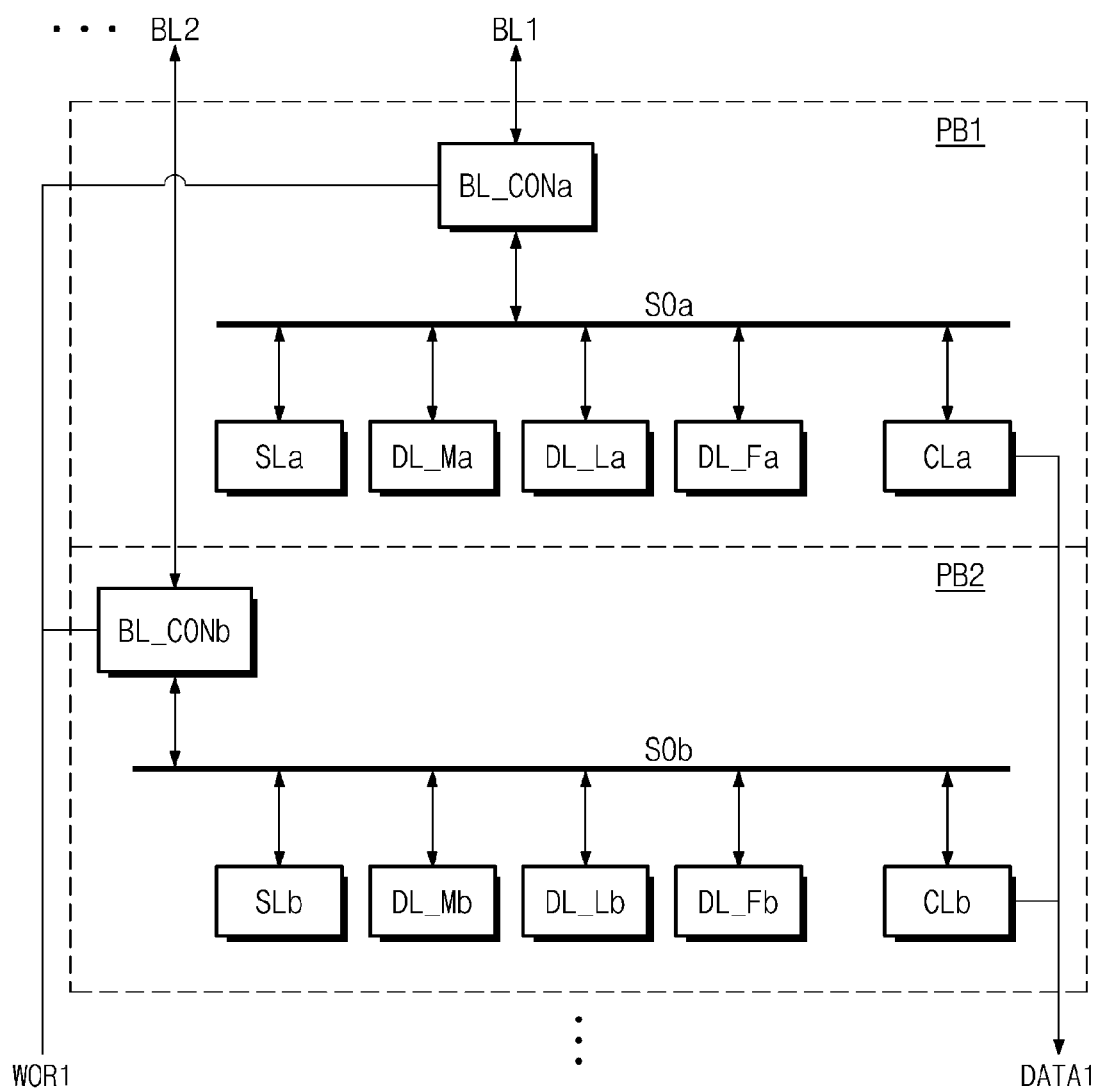
FIG. 4 is a block diagram of a page buffer circuit in FIG. 2.

FIG. 4 is a block diagram of a page buffer circuit 140 in FIG. 2. As illustrated, the page buffer circuit 140 may include a plurality of page buffers PB1 to PBn.

The page buffers PB1 to PBn included in the page buffer circuit 140 share a verify signal line WOR1 and a data line DATA1. The page buffer circuit 140 performs data transmission between the page buffers PB1 to PBn via the verify signal line WOR1.

Each of the page buffers PB1 to PBn may include a bitline controller BL_CON, a sensing latch SL, a plurality of data latches DL_M, DL_L, and DL_F, and a cache latch CL. The configuration and operation of the page buffers PB1 to PBn will be described by using the first page buffer PB1 as an example. However, the configuration and operation of the first page buffer PB1 may be applied to the second to $n^{th}$ page buffers PB2 to PBn and the subscript "a" applied, below, in the description of the first page buffer may be changed to "b" for the second page buffer PB2, changed to "c" for the third page buffer PB3, etc.

A bitline controller BL_CONa is coupled between a sensing node SOa and a first bitline BL1. The bitline controller BL_CONa is connected to the verify signal line WOR1. The bitline controller BL_CONa shares the verify signal line WOR1 with bitline controllers BL_CONb to BL_CONn of the second to $n^{th}$ page buffers PB2 to PBn. The bitline controller BL_CONa may precharge the first bitline BL1. A bitline precharge operation may be performed during a read, program or verify operation of the nonvolatile memory device 100. For example, the bitline controller BL_CONa may be included in the control logic and voltage generator 130.

A sensing latch SLa is connected to a sensing node SOa. The sensing latch SLa senses a voltage of the sensing node SOa developed through the first bitline BL1. The sensing latch SLa performs a dumping operation together with a plurality of data latches DL_Ma, DL_La, and DL_Fa. The dumping operation will be described later in detail with reference to FIG. 5.

The data latches DL_Ma, DL_La, and DL_Fa are connected to the sensing node SOa. The data latches DL_Ma, DL_La, and DL_Fa may perform a dumping operation between the data latches DL_Ma, DL_La, and DL_Fa, a cache latch CLa or the data latches DL_Ma, DL_La, and DL_Fa. Referring to FIG. 4, the data latches DL_Ma, DL_La, and DL_Fa include three latches. However, example embodiments of disclosure are limited thereto.

The cache latch CLa is connected to the sensing node SOa. The cache latch CLa may perform a dumping operation together with the data latches DL_Ma, DL_La, and DL_Fa. The cache latch CLa may output dumped data to an external entity. In addition, the cache latch CLa may receive data from an external entity for a program operation. The cache latch CLa may sequentially transmit the received data to the data latches DL_Ma, DL_La, and DL_Fa.

During a program verify operation, the first page buffer PB1 operates as follows. When a verify voltage Vfy is applied to a gate of a selected memory cell MC, the first page buffer PB1 senses whether the selected memory cell MC is an ON cell or an OFF cell with respect to the verify voltage Vfy and stores a sensing result in the sensing latch SLa. In this case, the data latches DL_Ma, DL_La, and DL_Fa are maintained at logic '1' that is an initial value.

The sensing latch SLa transmits the data sensed through the dumping operation to the F latch DL_Fa. Then stored data of the F latch DL_Fa and stored data of the L latch DL_La are simultaneously transmitted to the M latch DL_Ma through a dumping operation. Thus, the data stored in the M latch DL_Ma is a logical OR result using the stored data of the F latch DL_Fa and the stored data of the L latch DL_La. To achieve this logical OR result, bar data (i.e., inverted data) of each of the F latch DL_Fa and the L latch DL_La are logically ANDed and opposite data (i.e., inverted data) of the logical AND result is stored in the F latch DL_Fa. This will be described later with reference to FIG. 6. Then the F latch DL_Fa transmits the stored data to the L latch DL_La through a dumping operation.

Then the sensing latch SLa receives sensing data of the next cell from a sensing latch SLb of the second page buffer PB2. The first page buffer PB1 repeats the foregoing operation to accumulate results of the repetition in the M latch DL_Ma and the L latch DL_La. Finally, the first page buffer PB1 repeats the foregoing operation until accumulation of sensing data of the first to $n^{th}$ pages PB1 to PBn is complete.

Final stored data in the L latch DL_La indicates whether at least one of the memory cells MC connected to the first wordline WL1 fails. Final stored data in the M latch DL_Ma indicates whether at least two of the memory cells MC connected to the first wordline WL1 fail. This will be described later with reference to FIGS. 7 and 10. As a result, the accumulated stored data of the L latch DL_La and the M latch DL_Ma indicate whether the memory cells MC connected to the first wordline WL1 fail. Thus, the page buffer circuit 140 does not output all data from the page buffers PB1 to PBn but outputs only a result stored in the L latch DL_La and the M latch DL_Ma when verifying a program operation of a reference unit of the memory block BLKa.

The foregoing duping operation will be described below with reference to FIG. 5. The foregoing logical OR operation will be described later with reference to FIG. 6. The foregoing sensing data transmission of the page buffers PB1 to PBn will be described later with reference to FIGS. 8 and 9.

Sensing node SOb in page buffer PB2 is similar to sensing node SOa in page buffer PB1. And latches DL_Mb, DL_Lb, DL_Fb, and CLb within page buffer PB2 operate similarly to latches DL_Ma, DL_La, DL_Fa, and CLa within page buffer PB1.

Figure 5:
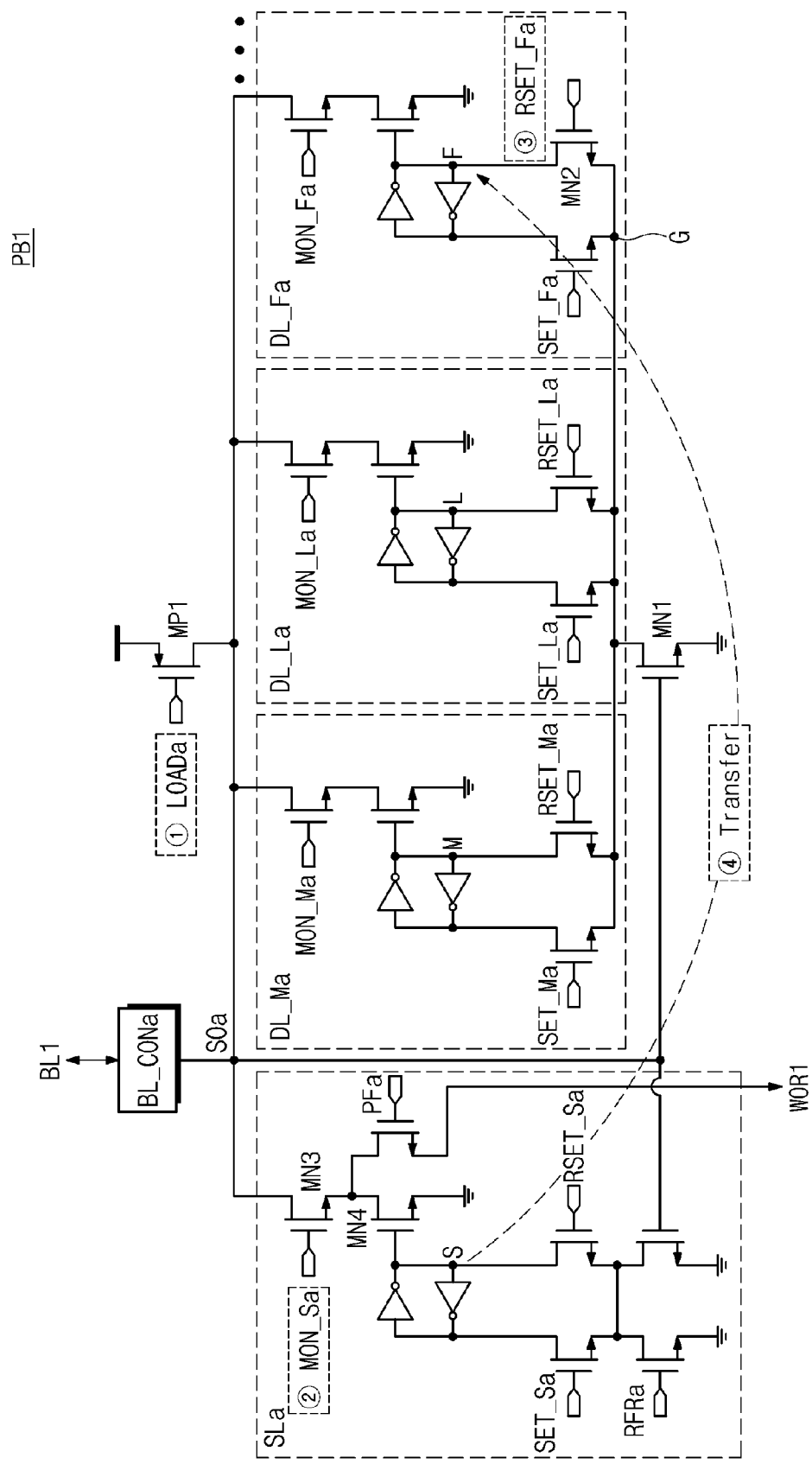
FIG. 5 is a circuit diagram illustrating a data dumping operation of a page buffer in FIG. 4.

FIG. 5 is a circuit diagram illustrating a data dumping operation of a page buffer in FIG. 4. Referring to FIG. 5, the sensing latch SLa of the first page buffer PB1 may dump data to the F latch DL_Fa. The F latch DL_Fa may dump data to the L latch DL_La.

Prior to description of a dumping operation, the procedure of developing the sensing node SOa from the first bitline BL1 will be described. During a program verify operation in which a verify voltage Vfy is applied, the first page buffer PB1 precharges the bitline BL1 to detect an on/off state of a selected memory cell MC. At this point, the first bitline BL1 may be precharged by a load transistor MP1 and the bitline controller BL_CONa. The sensing node SOa is provided with a develop result of the first bitline BL1 that transits to different voltage levels depending on whether the selected memory cell MC is turned on or off.

The bitline controller BL_CONa precharges the sensing node SOa in response to activation of the load transistor MP1 to transfer the develop result of the bitline BL1 to the sensing node SOa. The first bitline BL1 is connected to the sensing node SOa by the bitline controller BL_CONa. Thus, a voltage level of the sensing node SOa varies depending on a potential of the first bitline BL1. This operation is referred to as "sensing node develop (SO Develop)". A node S of the sensing latch SLa is set by the potential of the developed sensing node SOa in response to activation of a sensing latch signal RSET_Sa.

Now, the procedure for a dumping operation will be described. The procedure is represented by reference numerals ①, ②, ③, and ④. A control signal LOADa for precharging the sensing node SOa is activated to migrate data of the sensing latch SLa to the F latch DL_Fa (step ①). According to the activation of the control signal LOADa, the sensing node SOa may be charged to a driving voltage (VDD) level by the load transistor MP1.

A control signal MON_Sa is activated to develop the sensing node SOa according to a data state of the sensing latch SLa (step ②). A voltage of a node G varies depending on whether a ground voltage MN1 is switched. An F latch reset signal is activated to turn on the second NMOS transistor MN2 (step ③). A voltage of a node F varies depending on the voltage of the node G.

For example, assuming that stored data of the sensing latch SLa is logic '0', the node S of the sensing latch SLa may be maintained at a ground voltage GND. Accordingly, since a third NMOS transistor MN3 is turned off, a voltage level of the sensing node SOa is maintained at a driving voltage VDD. Thus, the ground transistor MN1 is turned on and the voltage level of the node G is made to be a ground voltage (GND) level. The node F is connected to the node G by the step ③. As a result, the voltage of the node F is made to be the ground voltage GND and the F latch DL_Fa stores logic '0'.

For example, when stored data of the sensing latch SLa is logic '1', a voltage level of the sensing node SOa changes to the ground voltage (GND) level through third and fourth NMOS transistors MN3 and MN4. Accordingly, the ground transistor MN1 is turned off and the node G is made to be in a floating state. By the step ③, the node F is connected to the node G that is in the floating state. However, since a voltage of a node F is maintained by two inverters, the voltage of the node F does not vary. Since an initial value of the F latch DL_Fa is logic '1', stored data of the F latch DL_Fa is maintained at logic '1'. As a result, data stored in the node S of the sensing latch SLa is transferred to the node F of the F latch DL_Fa by the dumping operation (step ④).

So far, a dumping operation from the sensing latch SLa to the F latch DL_Fa has been described. A dumping operation between a plurality of data latches DL_Ma, DL_La, and DL_Fa and the cache latch CLa is identical to the above-described dumping operation. A dumping operation from the F latch DL_Fa to the L latch DL_La will be briefly described as an example.

First, the sensing node SOa is precharged by the load transistor MP1. Then the sensing node SOa is developed by a control signal MON_Fa. The node G and the node L are connected with each other by an L latch reset signal RSET_La. As a result, data stored in the node F of the F latch DL_Fa is transferred to the node L of the L latch DL_La by a dumping operation.

Figure 6:
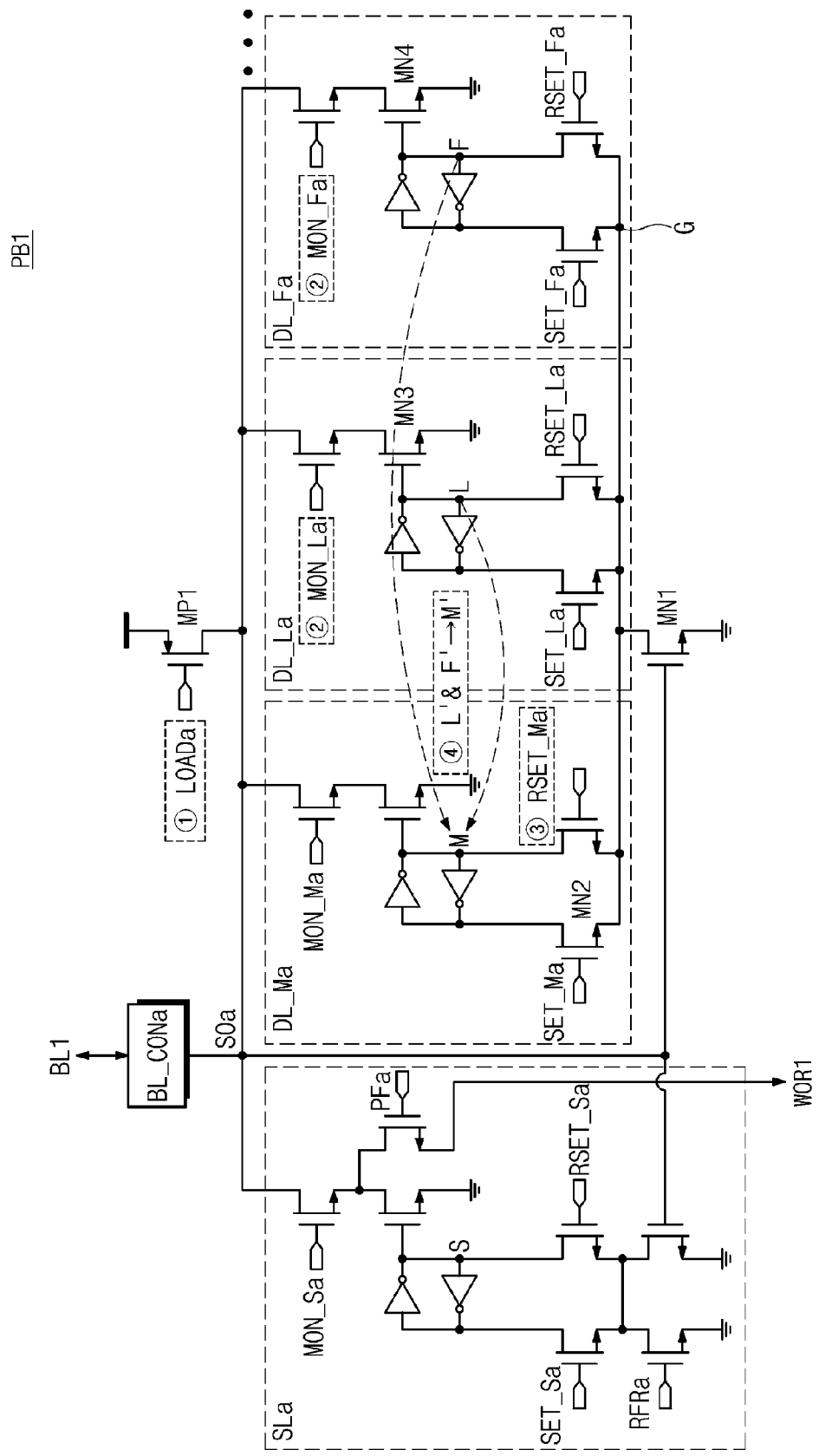
FIG. 6 is a circuit diagram illustrating an OR operation of the page buffer in FIG. 4.

FIG. 6 is a circuit diagram illustrating an OR operation of the page buffer in FIG. 4. Referring to FIG. 6, the first page buffer PB1 may store the stored data of the F latch DL_Fa and the stored data of the L latch DL_La in an M latch DL_M after logically ORing the stored data of the F latch DL_Fa and the stored data of the L latch DL_La. The logical OR operation is similar to the data dumping operation in FIG. 5.

Now, the procedure for the logical OR operation will be described. The procedure is represented by reference numerals ①, ②, ③, and ④. First, a control signal LOADa for precharging the sensing node SOa is activated to dump data of the F latch DL_Fa and data of the L latch DL_La (step ①). According to the activation of the control signal LOADa, the sensing node SOa may be charged to a driving voltage (VDD) level by the turned-on load transistor MP1.

Then, control signals MON_Fa and MON_La are activated to develop the sensing node SOa according to data states of the F latch DL_Fa and the L latch DL_La (step ②). The ground transistor MN1 may be switched or not switched according to a developed level of the sensing node SOa. A voltage of the node G may vary depending on whether the ground transistor MN1 is switched. Then an M latch reset signal RSET_Ma is activated to turn on the second NMOS transistor MN2 (step ③). A voltage of the node M varies depending on a voltage of the node G.

For example, it will be assumed that both stored data of the F latch DL_Fa and stored data of the L latch DL_La are logic '0'. Under the assumption, since third and fourth NMOS transistors MN3 and MN4 are turned off, a voltage level of the sensing node SOa is maintained at a driving voltage (VDD) level. Thus, the ground transistor MN1 is turned on and a voltage level of the node G is made to be a ground voltage (GND) level. Then the node M is connected to the node G by the step ③. As a result, a voltage of the node M is made to be a ground voltage GND and the M latch DL_Ma stores data '0'.

For example, when the stored data of at least one of the F latch DL_Fa and the L latch DL_La is logic '1', a voltage level of the sensing node SOa changes to the ground voltage (GND) level through the third NMOS transistor MN3 or the fourth NMOS transistor MN4. Thus, the ground transistor MN1 is turned off and the node G is made to be in a floating state. By the step ③, the node M is connected to the node G that is in the floating state. However, since the voltage of the node M is maintained by two inverters, the voltage of the node M does not vary. Since an initial value of the M latch DL_Ma is logic '1', stored data of the M latch DL_Ma is maintained at logic '1'. A logic table of a result obtained by the logical OR operation is shown below.

TABLE 1

| F' | L' | M' |
|---|---|---|
| 0 | 0 | 0 |
| 1 | 0 | 1 |
| 0 | 1 | 1 |
| 1 | 1 | 1 |

As a result, the data stored in the F latch DL_Fa and the data stored in the L latch DL_La are logically ORed by the dumping operation to be transferred to the node F of the M latch DL_Ma (step ④). To achieve this logical ORing, opposite data (i.e., inverted data) of a value obtained by logically ANDing bar data F' (i.e., inverted data) of the F latch DL_Fa and bar data L' (i.e., inverted data) of the L latch DL_La are stored in the M latch DL_Ma.

Similar to how the MON_Sa, MON_La, and MON_Fa control signals operate with respect to latches SLa, DL_La and DL_Fa, respectively, so too does control signal MON_Ma operate with respect to latch DL_Ma. Control signals SET_Sa, SET_Ma, SET_La, and SET_Fa are respectively applied to set latches SLa, DL_Ma, DL_La, and DL_Fa.

Figure 7:
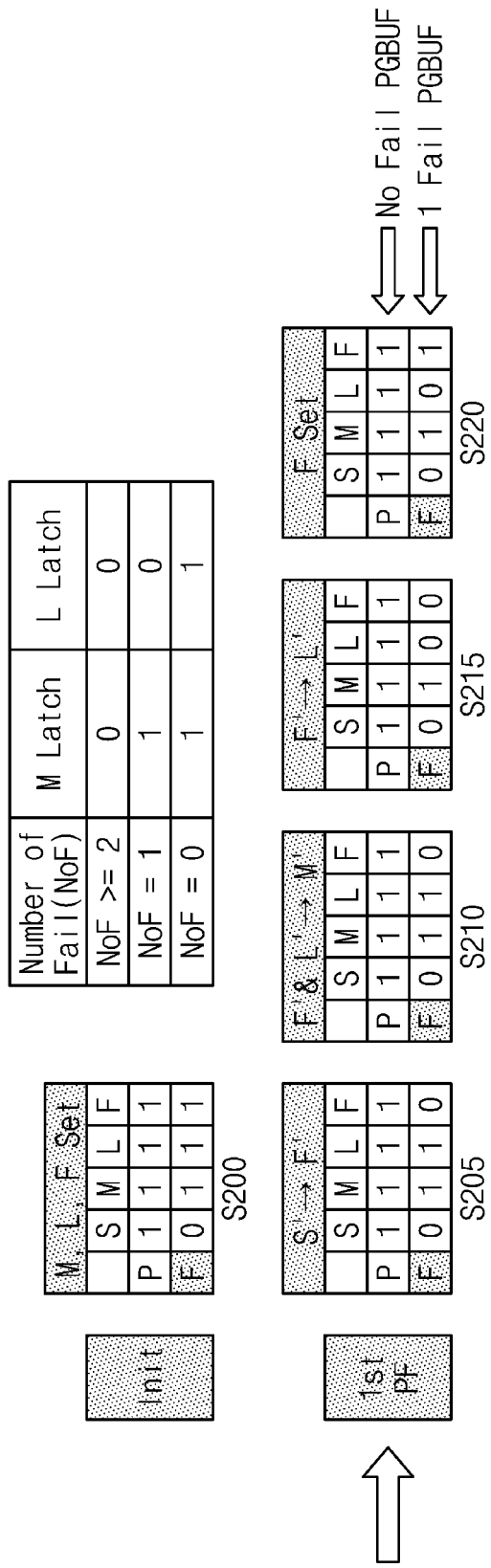
FIG. 7 illustrates a method for processing sensing data of the page buffer in FIG. 4.

FIG. 7 illustrates a method for processing sensing data of the page buffer in FIG. 4. Referring to FIG. 7, the first page buffer PB1 may process data sensed from a memory cell MC connected to the first wordline WL1 and the first bitline BL1. This is identical to S120 in FIG. 3. The first page buffer PB1 performs dumping and logic OR operations by means of the method described with reference to FIGS. 5 and 6. Accordingly, FIG. 7 will be described with reference to FIGS. 5 and 6.

In S200, there are shown cases where sensing data of the first page buffer PB1 is in a pass state P and a failure state F, respectively. In the tables, S represents sensing data of the sensing latch Sla, and M, L, and F identify stored data of the M latch DL_Ma, the L latch DL_La, and the F latch DL_Fa, respectively. Initial values of S, M, L, and F are set to logic '1'. The sensing latch SLa senses data of a selected memory cell MC from the first bitline BL1. In case of the pass state P, the sensing latch SLa senses a voltage corresponding to the logic '1' from the memory cell MC to store data. Thus, the S, M, L, and F are all made to be logic '1'.

Meanwhile, in case of the failure state F, the sensing latch SLa senses a voltage corresponding to logic '0' from the memory cell MC to store data. Thus, the S becomes logic '0' and the M, L, and F remain logic '1'.

In S205, data is dumped from the sensing latch SLa to the F latch DL_Fa. In S210, a logical OR value of the F latch DL_Fa and data of the L latch DL_La are stored in the M latch DL_Ma. In S215, the data is dumped from the F latch DL_Fa to the L latch DL_La. In S220, the data of the F latch DL_Fa is initialized. Thus, the F becomes logic '1', which is aimed to process and accumulate the next sensing data. However, compared to an operation of F latch DL_Fa, M latch DL_Ma and L latch DL_La are not initialized. Therefore, after the data of L latch DL_La becomes logic '0', L latch DL_La is maintained at logic '0' even after dumping operation is performed. Similarly, after the data of M latch DL_Ma becomes logic '0', M latch DL_Ma is maintained at logic '0' even after logical OR operation is performed.

When processing the data sensed from the first memory cell MC is completed, the S, M, L, and F become logic '1' in case of the pass state P. In case of the failure state F, the S and L become logic '0' and the M and F become logic '1'. A processing result is stored in the M and L.

Meanings of M and L will now be described with reference to tables in FIG. 7. An M value of zero indicates that at least two of the memory cells MC connected to the first wordline WL1 fail. An L value of zero indicates that at least one of the memory cells MC connected to the first wordline WL1 fails. When no memory cell MC fails, both M and L values become logic '1'. When one memory cell MC fails, the M value is logic '1' and the L value becomes logic '0'. When at least two memory cells MC fail, both the M and L values become logic '0'. Thus, the M and L values indicate types of failure that occurs in a memory cell MC connected to the first wordline WL1.

The operations and configurations of the data latches DL_Ma, DL_La, and DL_Fa may be identical to each other. Accordingly, dumping and logic OR operations between the sensing latch SLa and the data latches DL_Ma, DL_La, and DL_Fa may be performed through latches having the same operation and configuration, not through the foregoing specific latch.

By means of a data transmission method that will be described with reference to FIGS. 8 and 9, the first page buffer PB1 receives sensing data from the other page buffers PB2 to PBn to repeat S205 to S220. This will be described later with reference to FIG. 10.

Figure 8:
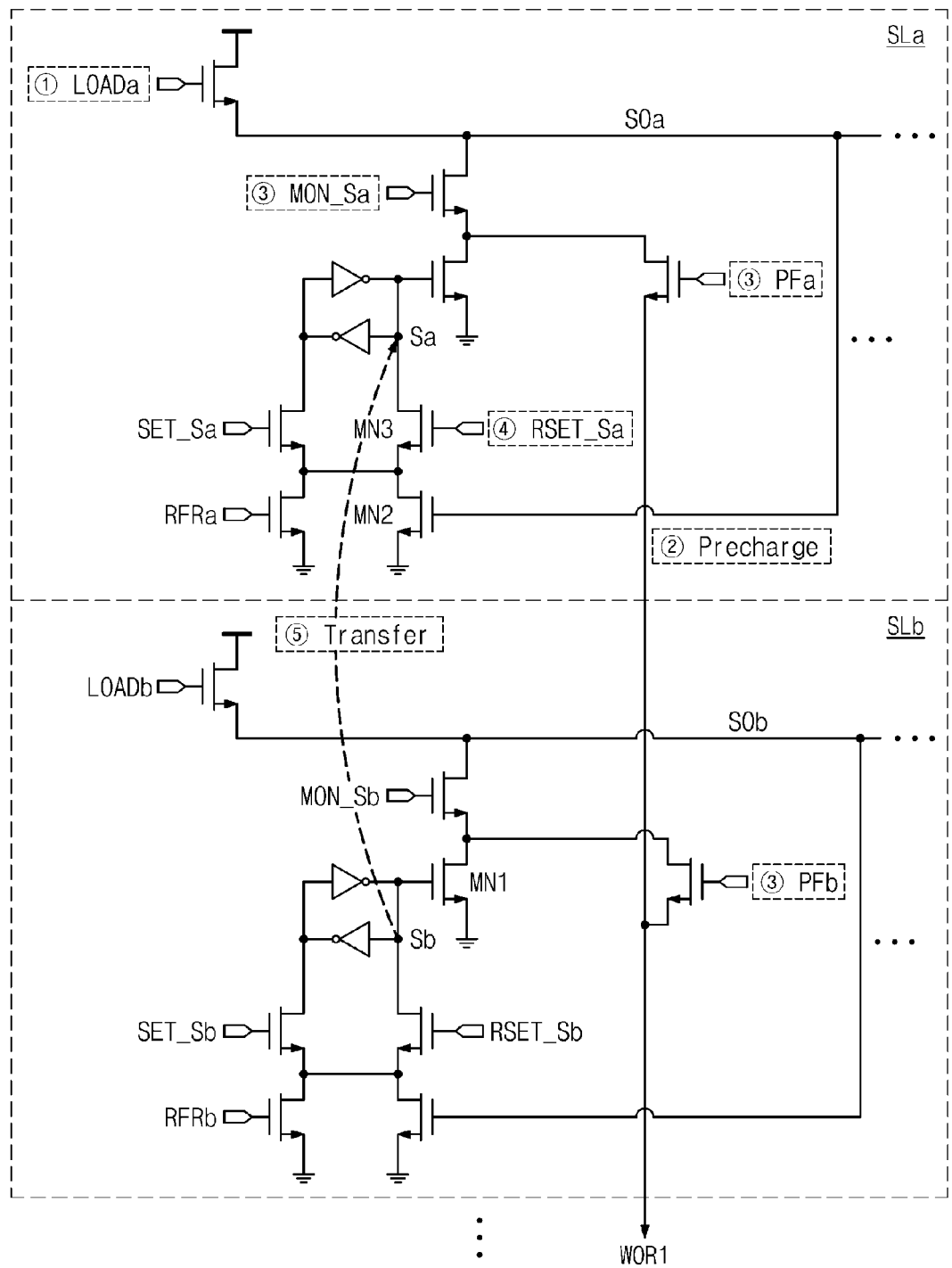
FIG. 8 is a circuit diagram illustrating a data transmission operation between page buffers in FIG. 4.

FIG. 8 is a circuit diagram illustrating a data transmission operation between page buffers in FIG. 4. Referring to FIG. 8, the second page buffer PB2 may transmit sensing data to the first page buffer PB1, which is identical to S140 in FIG. 3.

The first and second page buffers PB1 and PB2 include sensing latches SLa and SLb, respectively. Transmission of sensing data is performed between the sensing latches SLa and SLb. Accordingly, only the sensing latches SLa and SLb included in the first and second page buffers PB1 and PB2 are shown in FIG. 8. The configurations of the first and second page buffers PB1 and PB2 can be readily understood with reference to FIGS. 4 to 6.

The procedure for a transmission operation of sensing data will now be described. The procedure is represented by reference numerals ①, ②, ③, ④, and ⑤. A control signal LOADa is activated (step ①). A sensing node SOa is precharged to a driving voltage (VDD) level. A verify signal line WOR1 is precharged to the driving voltage (VDD) level to transmit sensing data of the second page buffer PB2 to the first page buffer PB1 (step ②).

Control signals MON_Sa, PFa, and PFb are activated to develop the sensing node SOa according to a data state of the sensing latch SLb of the second page buffer PB2 (step ③). Thus, the sensing node SOa is connected to the verify signal line WOR1. The sensing node SOa is developed according to data stored in a node Sb of the sensing latch SLb of the second page buffer PB2. For example, when logic '1' is stored in the node Sb, a first NMOS transistor MN1 is turned on to change a voltage of the sensing node SOa into a ground voltage GND. Meanwhile, when logic '0' is stored in the node Sb, the first NMOS transistor MN1 is turned off to maintain the voltage of the sensing node SOa at a driving voltage VDD. To switch the ground transistor MN2 depends on a developed level of the sensing node SOa. A voltage of the node G varies depending on whether the ground transistor MN2 is switched.

A third NMOS transistor MN3 is turned on by activating a sensing latch reset signal RSET_Sa of the first page buffer PB1 (step ④). A node Sa is connected to the node G, and a voltage of the node Sa varies depending on a voltage of the node G. As a result, stored data of the sensing latch SLb of the second page buffer PB2 is transmitted to the sensing latch SLa of the first page buffer (step ⑤). The steps ④ and ⑤ are identical to the steps ③ and ④ of the data dumping operation in FIG. 5. The transmission operation of the sensing data may be applied between a plurality of page buffers PB1 to PBn.

Sensing node SOb within latch SLb operates similarly to sensing node SOa within latch SLa. And control signals LOADb, SET_Sb, MON_Sb, and RSET_Sb within latch SLb respectively operate similarly to control signals LOADa, SET_Sa, MON_Sa, and RSET_Sa in latch SLa. Control signal RFRa cooperates in latch SLa with control signals SET_Sa and RSET_Sa, and control signal RFRb cooperates in latch SLb with control signals SET_Sb and RSET_Sb.

Figure 9:
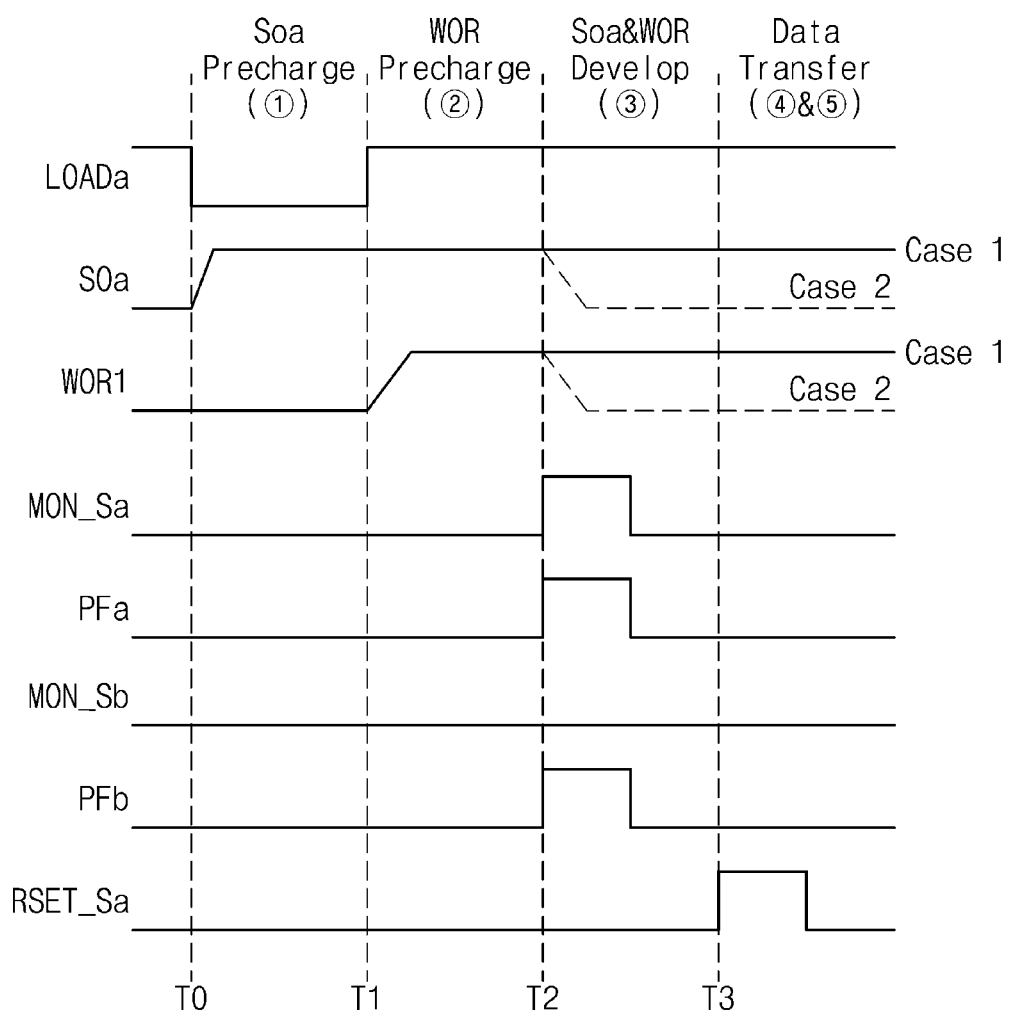
FIG. 9 is a timing diagram illustrating variation of a control signal during the data transmission operation in FIG. 8.

FIG. 9 is a timing diagram illustrating variation of a control signal during the data transmission operation in FIG. 8. FIG. 9 will be described with reference to FIG. 8.

At a time point T0, the control signal LOADa changes into a low level. Then the sensing node SOa is precharged to the driving voltage (VDD) level, which is identical to the step ① in FIG. 8.

At a time point T1, the verify signal line WOR1 is precharged to the driving voltage (VDD) level, which is identical to the ② step in FIG. 8. At a time point T2, the sensing node SOa and the verify signal line WOR1 are developed. In this case, the control signals MON_Sa, PFa, and PFb go to a high level and a control signal MONS_Sb is maintained at a low level, which is identical to the step ③ in FIG. 8. When data of the sensing latch SLb of the second page buffer PB2 is logic '0', the sensing node SOa is maintained at the driving voltage VDD (Case 1). When data of the sensing latch SLb of the second page buffer is logic '1', the sensing node SOa is developed to the ground voltage GND (Case 2).

At a time point T3, the stored data of the sensing latch SLb of the second page buffer PB2 is transmitted to the sensing latch SLa of the first page buffer PB1. In this case, the sensing latch reset signal RSET_Sa goes to a high level, which is identical to the steps ④ and ⑤ in FIG. 8. Control signal MON_Sb of latch SLb remains at a low level "0" throughout times T0 to T3.

Figure 10:
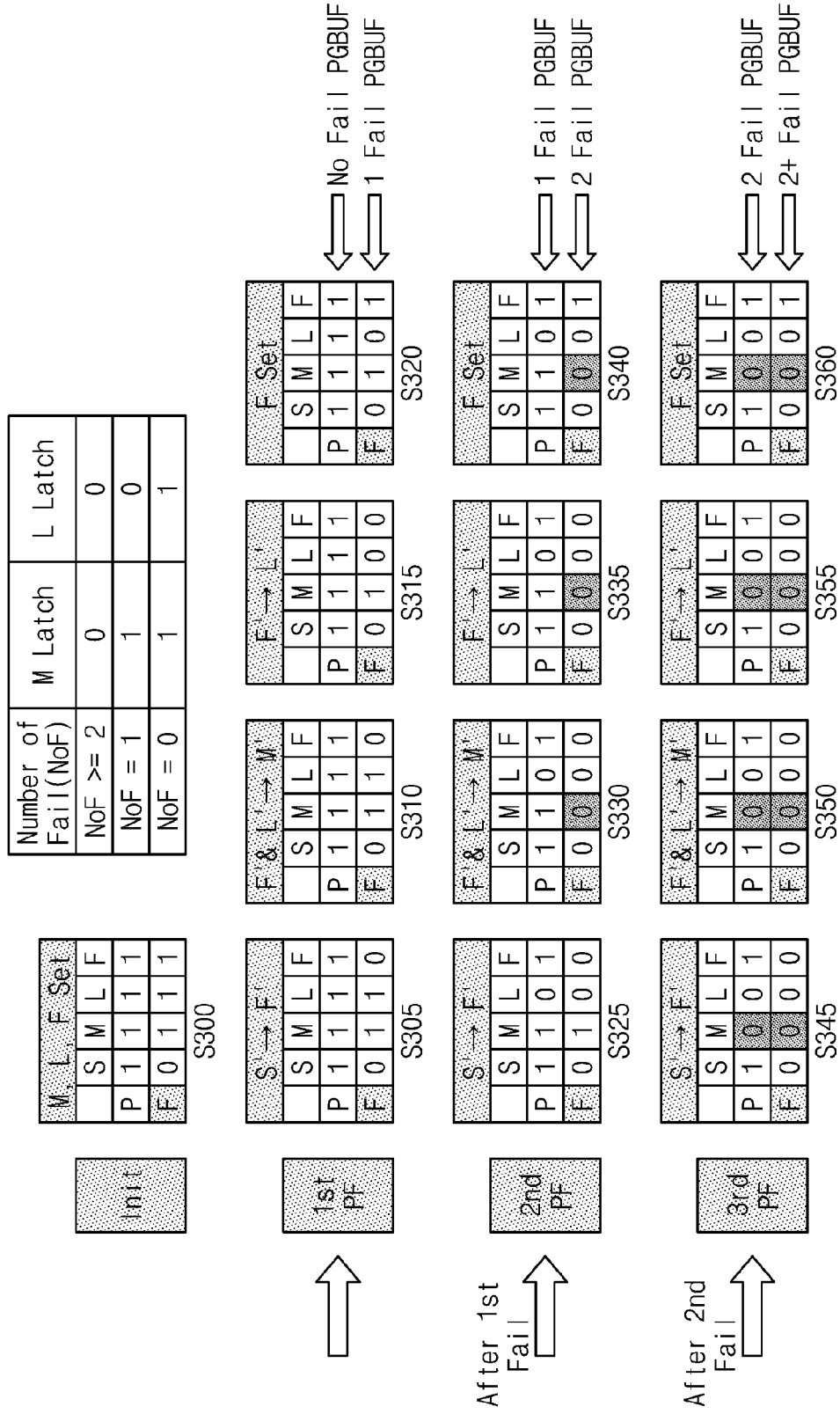
FIG. 10 illustrates a method for accumulating and processing sensing data of the page buffer in FIG. 4.

FIG. 10 illustrates a method for accumulating and processing sensing data of the page buffer in FIG. 4, which is identical to S120 to S140 in FIG. 3. Referring to FIG. 10, the first page buffer PB1 may accumulate and process data sensed from all memory cells MC. The first page buffer PB1 may perform a dumping operation, a logic OR operation, and a sensing data transmission operation by means of the methods described with reference to FIGS. 5, 6, 8, and 9. Therefore, FIG. 10 will be described with reference to FIGS. 5, 6, 8, and 9.

Since S300 to S320 are identical to S200 to S220 in FIG. 7, their descriptions will be omitted herein. It will be assumed that processing is performed in a failure state of S320, i.e., one failure occurs in the first page buffer PB1.

In S325, sensing data is transmitted from the sensing latch SLb of the second page buffer PB2 to the sensing latch SLa of the first page buffer PB1. Then data is dumped from the sensing latch SLa to the F latch DL_Fa. A pass state P is a case where data sensed by the sensing latch SLb of the second page buffer PB2 is pass data. That is, the pass state P is a case where no failure occurs in a memory cell MC connected to the first wordline WL1 and the second bitline BL2. Thus, S and F become logic '1'. A failure state F is a case where data sensed by the sensing latch SLb of the second page buffer PB2 is fail data. In this case, S and F become logic '0'.

In S330, data of the F latch DL_Fa and the L latch DL_La are logically ORed to be stored in the M latch DL_Ma. In S335, data jumps from the F latch DL_Fa to the L latch DL_La. In S340, the data of the F latch DL_Fa is initialized. Thus, the F becomes logic '1', which is aimed to process and accumulate the next sensing data. As a result of the processing, the M remains logic '1' and the L remains logic '0' in the pass state P, which means that a failure has occurred in only one of memory cells MC connected to the first and second page buffers PB1 and PB2. Additionally, both the M and the L become logic '0' in the failure state F, which means that a failure occurs in all the memory cells MC connected to the first and second page buffers PB1 and PB2.

Then it will be assumed that processing is performed in a failure sate of S340, i.e., two failures occur in the first and second page buffers PB1 and PB2. Accordingly, each of the M and the L is maintained at logic '0'. The first page buffer PB1 receives sensing data from the third page buffer PB3. Since S345 to S360 are identical to S325 to S340, their descriptions will be omitted herein.

In S360, the first page buffer PB1 accumulates and outputs whether a memory cell MC connected to the first to third pages PB1 to PB3 fails. Since two or more failures occur in both the pass state P and the failure state F, the M and the L are maintained at logic '0'.

The first page buffer PB1 repeatedly performs the foregoing operation on the fourth to $n^{th}$ page buffers PB4 to PBn. Thus, the first page buffer PB1 may accumulate a failure result of a plurality of memory cells MC connected to the first wordline WL1.

For example, M and L data may be sequentially output to an external entity via the cache latch CLa. A bad block processing or repair operation of a memory cell MC may be performed using the M and L data. For example, when the M is logic '1' and the L is logic '0', the nonvolatile memory device 100 may repair failed memory cells with column auxiliary memory cells. Alternatively, when the M and the L are logic '0', the nonvolatile memory device 100 may process a block including the failed memory cells MC as a bad block. This means a progressive defect via the first wordline WL1, which is because the same failure may occur in the block including the failed memory cells MC. With the above-described operation, time required to test the memory cell array 110 may be reduced.

Figure 11:
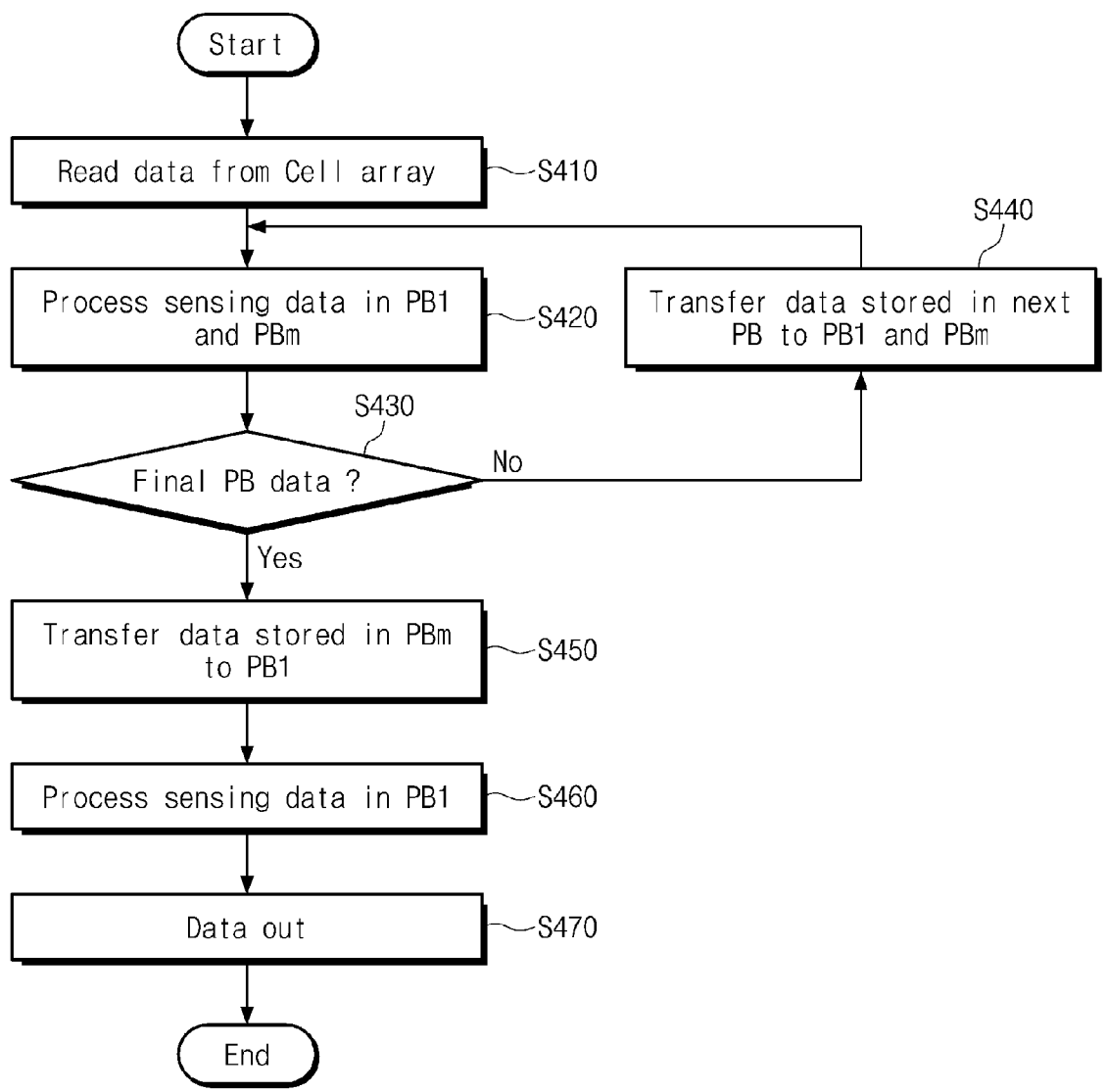
FIG. 11 is a flowchart summarizing a program verify method according to another example embodiment of the disclosure.

FIG. 11 is a flowchart summarizing a program verify method according to example embodiments of disclosure. Referring to FIG. 11, first and $m^{th}$ page buffers PB1 and PMm of the page buffer circuit 140 may process sensing data to reduce data processing time. Since S410 and S420 are identical to S110 and S120 in FIG. 3, their descriptions will be omitted or abbreviated herein.

In S420, the first and $m^{th}$ page buffers PB1 and PBm process data to detect a failure of a corresponding memory cell MC from sensed data. The first and $m^{th}$ page buffers PB1 and PBm process the sensed data to detect failures of first and $m^{th}$ memory cells MC respectively connected to a first bitline BL1 and an $m^{th}$ bitline BLm of the first wordline WL1 (m<n).

In S430, each of the first and $m^{th}$ page buffers PB1 and PBm determines whether the processed data is sensing data of the last page buffer for a corresponding page buffer. The last page buffer for the first page buffer PB1 may be an $(m-1)^{th}$ page buffer PBm-1, and the last page buffer for the $m^{th}$ page buffer PBm may be an $n^{th}$ page buffer PBn. When the processed data is not data of the last page buffer (the "No" outcome in FIG. 11), the flow proceeds to S440. When the processed data is data of the last page buffer (the "Yes" outcome in FIG. 11), the flow proceeds to S450.

In S440, next page buffers of the first and $m^{th}$ page buffers PB1 and PBm provide sensed data to the first and $m^{th}$ page buffers PB1 and PBm, respectively. That is, the first page PB1 sequentially receives and accumulates sensed data of the second to $(m-1)^{th}$ page buffers PB2 and PBm to process data. In addition, the $m^{th}$ page buffer PMm sequentially receives and accumulate sensed data of $(m+1)^{th}$ to $n^{th}$ page buffers PBm+1 and PBn to process data. In other words, the page buffer circuit 140 divides the page buffers PB1 to PBn into two groups and each of the two groups accumulates and processes sensing data of a corresponding group to process data. This is because since the page buffers PB1 and PBm share the same verify signal line WOR1, their sensing data cannot be transmitted at the same time.

In S450, the $m^{th}$ page buffer PBm transmits the processed data to the first page buffer PB1. In S460, the first page buffer PB1 accumulates processed results of the m page buffers PBm to process sensing data. In S470, the first page buffer PB1 outputs the processed data to an external entity.

As a result, with the method described in FIG. 11, information on whether a memory cell MC fails may be received in a reference unit of the memory block BLKa. In addition, since the page buffer circuit 140 processes sensing data in the two page buffers PB1 and PBm, processing time may be reduced by half as compared to the method described in FIG. 3. For example, the page buffer circuit 140 may simultaneously process sensing data in two or more page buffers. In this case, processing time may be reduced in inverse proportion to the number of the page buffers.

Figure 12:
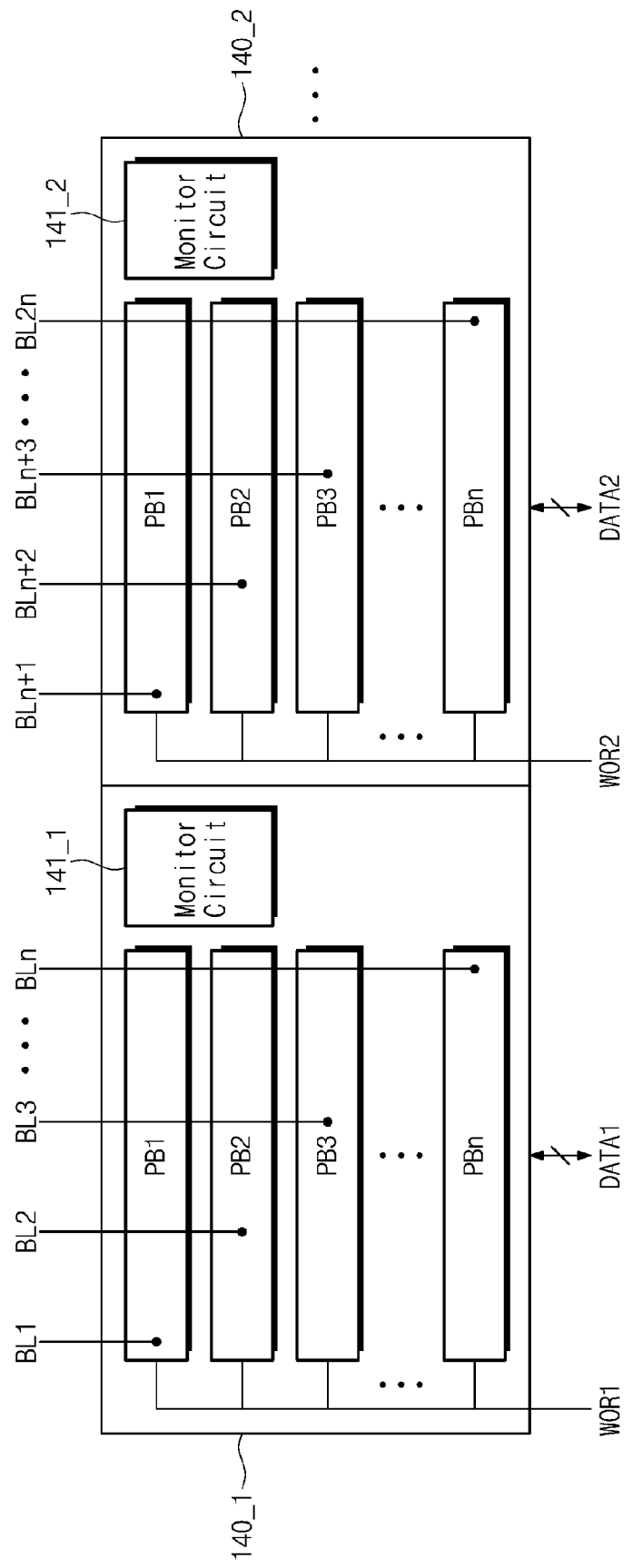
FIG. 12 is a block diagram of a page buffer circuit according to another example embodiment of the disclosure.

FIG. 12 is a block diagram of a page buffer circuit 140 according to example embodiments of the disclosure. As illustrated, the page buffer circuit 140 may include a plurality of page buffers PB1 to PBn and a monitor circuit 141. Page buffer circuit 140_1 includes page buffers PB1 to PBn, which are respectively connected to bit lines BL1 to BLn, are each connected to verify signal line WOR1, and communicate DATA1. Similarly, page buffer circuit 140_2 includes page buffers PB1 to PBn, which are respectively connected to bit lines BLn+1 to BL2n, are each connected to verify signal line WOR2, and communicate DATA2. Except for the monitor circuit 141, the configuration and operation of the page buffer circuit 140 are identical to those of the page buffer circuit 140 in FIG. 3 and will not be described in detail. Hereinafter, operation of the first monitor circuit 141_1 will be described with reference to first and second page buffer circuits 140_1 and 140_2.

The first monitor circuit 141_1 is connected to an M latch DL_Ma of a first page buffer PB1. The first monitor circuit 141_1 monitors stored data of the M latch DL_Ma and generates a stop flag when the stored data of the M latch DL_Ma changes into logic '0' while sensing data is processed. The stop flag stops processing of the first to $n^{th}$ page buffers PB1 to PBn or all the page buffer circuits 140_1 to 140_n included in a corresponding block. In a case where the stored data of the M latch DL_Ma is logic '0', the case means that two or more failures occur in a memory cell MC connected to a first wordline WL1, which means a progressive defect in a corresponding block. Accordingly, all the page buffers PB1 to PBn in the corresponding block need not process sensing data. As a result, a processing operation is stopped and the corresponding block is processed as a bad block.

Alternatively, the first monitor circuit 141_1 may be connected to an L latch DL_La of the first page buffer PB1. The second monitor circuit 141_2 may be connected to an L latch DL_Lb of the second page buffer PB2. The first and second monitors 141_1 and 141_2 may monitor each other.

Stored data of the L latches DL_La and DL_Lb indicate whether at least one of the memory cells connected to a corresponding wordline fails. The L latches DL_La and DL_Lb may operate in synchronization with a clock. Thus, the first and second monitor circuits 141_1 and 142_2 may monitor a position of the failed memory cell MC by counting a clock when the stored data of the L latches DL_La and DL_Lb change into logic '0'. Thus, the first and second monitor circuits 141_1 and 141_2 stop processing and generate a stop flag when two or more failures occurs in a memory cell MC within a predetermined distance. That is, in this case, a plurality of failures occurring in the memory cell MC within the predetermined distance may be detected irrespective of the division of a reference unit. Then the page buffer circuit 140 stops the processing operation and processes a corresponding block as a bad block. For example, the first and second monitor circuits 141_1 and 141_2 may include a counter for counting a clock, a register for storing count information, and the like.

Figure 13:
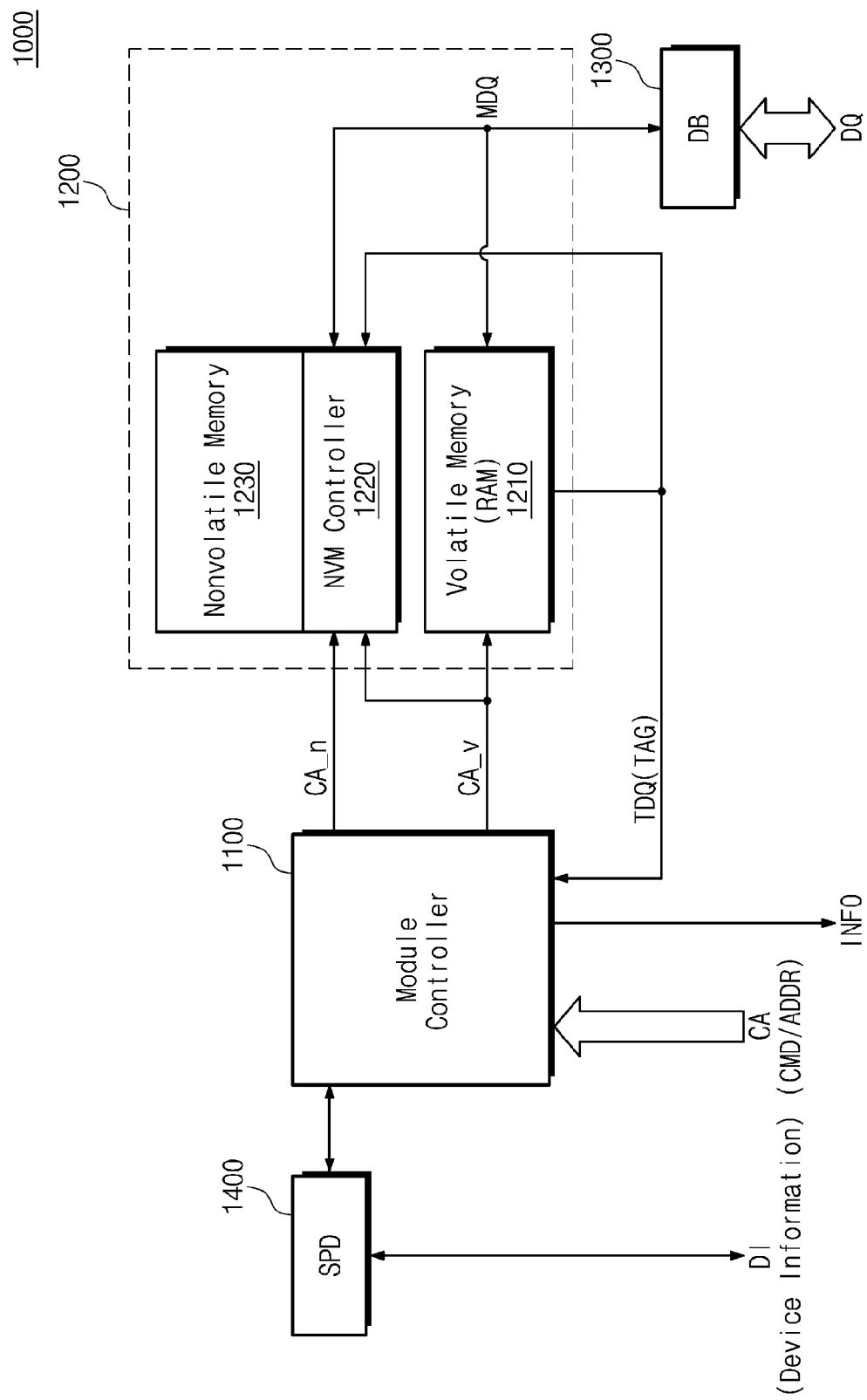
FIG. 13 is a block diagram of a nonvolatile memory module to which a nonvolatile memory device according to example embodiments of the disclosure is applied.

FIG. 13 is a block diagram of a nonvolatile memory module 1000 to which a nonvolatile memory device according to example embodiments of disclosure is applied. As illustrated, the nonvolatile memory module 1000 may include a module controller 1100, a heterogeneous memory device 1200, a data buffer 1300, and a serial presence detect (SPD) chip 1400.

The module controller 1100 may receive a command/address CA from a host (not shown) and control the heterogeneous memory device 1200 in response to the received command/address CA. The module controller may output information INFO.

The heterogeneous memory device 1200 includes a volatile memory 1210, an NVM controller 1220, and a nonvolatile memory 1230. The volatile memory 1210 may operate in response to VM command/address CA_v from the module controller 1100. The volatile memory device 1210 may output data and a tag TAG through a memory data line MDQ and a tag data line TDQ in response to the VM command/address CA_v, respectively. The volatile memory 1210 may write the data and the tag TAG received through the memory data line MDQ and the tag data line TDQ according to the VM command/address CA_v, respectively.

For example, the nonvolatile memory 1230 may be the nonvolatile memory device 100 including the page buffer circuit 140 described with reference to FIGS. 1 to 12. Alternatively, the nonvolatile memory 1230 may operate based on the operating method of the nonvolatile memory device 100 described with reference to FIGS. 1 to 12.

The NVM controller 1220 may operate in response to an NVM command/address CA_n from the module controller 1100. The NVM controller 1220 may perform various operations such as garbage collection, wear-leveling, and address translation to control the nonvolatile memory 1230.

The data buffer 1300 may receive data through the memory data line MDQ and provide the received data to the host (not shown) through a data line DQ. Alternatively, the data buffer 1300 may receive data through the data line DQ and output the received data through the memory data line MDQ. In example embodiments, the memory data line MDQ may be a data transmission path between components (e.g., a volatile memory, a nonvolatile memory, a data buffer, etc.) included in the nonvolatile memory module 1000 and the data line DQ may be a data transmission path between the nonvolatile memory module 1000 and the host (not shown). The tag data line TDQ may be a transmission line to transmit and receive the tag TAG.

The SPD chip 1400 may be an electrically erasable programmable read-only memory (EEPROM). The SPD chip 1400 may include initial information or device information (DI) of the nonvolatile memory module 1000.

Figure 14:
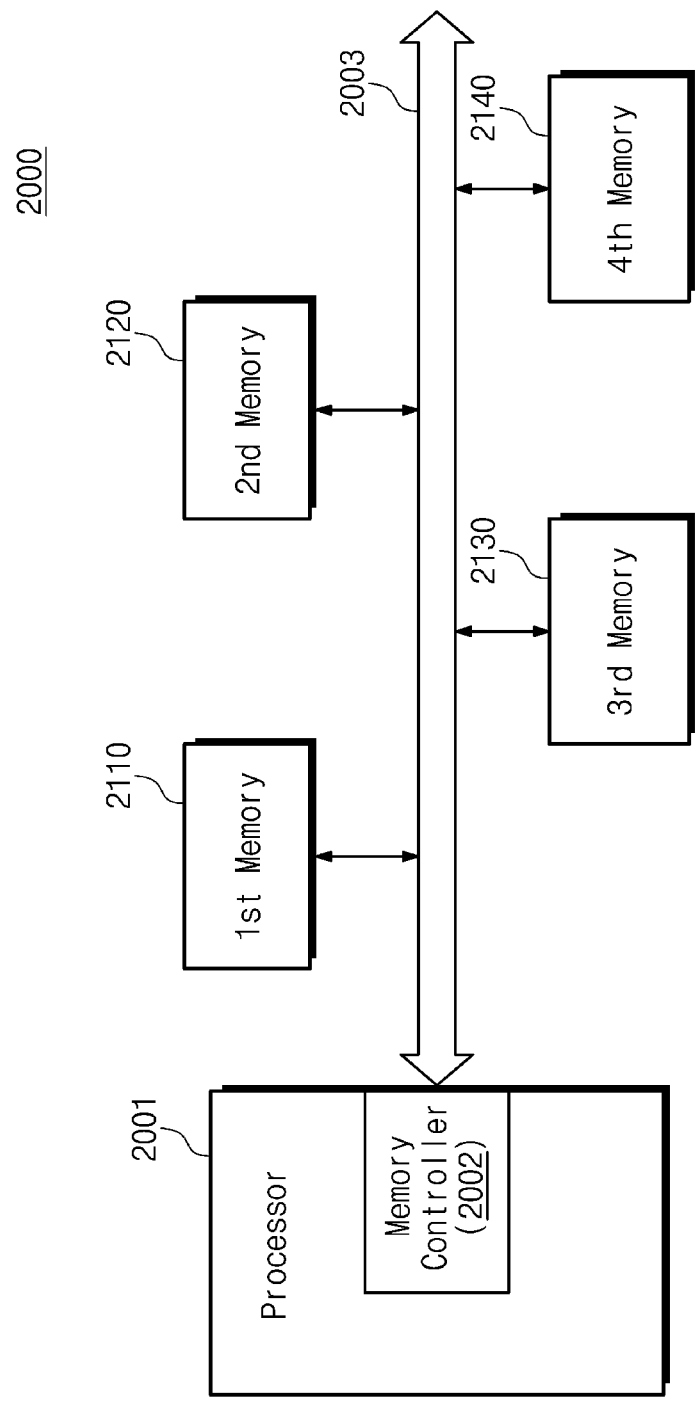
FIG. 14 is a block diagram of a user system to which a nonvolatile memory module according to example embodiments of the disclosure is applied.

FIG. 14 is a block diagram of a user system 2000 to which a nonvolatile memory module according to example embodiments of disclosure is applied. As illustrated, the user system 2000 may include a host processor 2001 and a plurality of memories 2110 to 2140.

The host processor 2001 may include a memory controller 2002. The memory controller 2002 may communicate with the memory modules 2110 to 2140 via a bus 2003. In example embodiments, at least some of the memory modules 2110 to 2140 may be the nonvolatile memory module 1000 in FIG. 13 described with reference to FIGS. 1 to 12 or may operate based on the operating method described with reference to FIGS. 1 to 12. For example, at least some of the memory modules 2110 to 2140 may include a nonvolatile memory, and the others may include a volatile memory. A memory module including a nonvolatile memory may be used as a cache memory of a memory module including a nonvolatile memory.

As described above, test time required for program verification of a memory cell may be reduced. As a result, test costs may be reduced.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Although detailed embodiments of the disclosure have been described, it should be understood that numerous other modifications, changes, variations, and substitutions can be devised by those skilled in the art. Moreover, it should be understood that the disclosure covers various techniques which can be readily modified and embodied based on the above-described embodiments.

What is claimed is:

1. A nonvolatile memory device comprising:
    a cell array including a plurality of memory cells;
    a first page buffer connected to a first memory cell of the cell array and configured to store first sensing data generated by sensing whether a program operation of the first memory cell is completed during a program verify operation; and
    a second page buffer connected to a second memory cell of the cell array and configured to generate first verify data based on second sensing data generated by sensing whether a program operation of the second memory cell is completed and store the first verify data, to receive the first sensing data from the first page buffer, and to store second verify data generated by accumulating the first sensing data and the first verify data during the program verify operation.

2. The nonvolatile memory device as set forth in claim 1, wherein the first sensing data is transmitted through a verify signal line that the first and second page buffers share.

3. The nonvolatile memory device as set forth in claim 2, wherein:
    the first page buffer includes a first sensing latch configured to latch the first sensing data, and
    the second page buffer includes a second sensing latch configured to latch the second sensing data.

4. The nonvolatile memory device as set forth in claim 3, wherein the verify signal line is shared by the first and second sensing latches.

5. The nonvolatile memory device as set forth in claim 3, wherein the second page buffer comprises:
    a first data latch configured to receive data from the second sensing latch through a dumping operation and store the received data;
    a second data latch configured to store previous data of the first data latch; and
    a third data latch configured to set data according to logical values respectively stored in the first and second data latches.

6. The nonvolatile memory device as set forth in claim 5, wherein the second data latch receives data from the first data latch through a dumping operation and stores the received data after data is set to the third data latch, and the first data latch is reset after the second data latch receives data from the first data latch.

7. The nonvolatile memory device as set forth in claim 5, wherein:
    the first sensing data is transmitted after the second page buffer generates the second verify data,
    the stored data of the second data latch indicates whether a program operation of the first memory cell or the second memory cell fails, and
    the stored data of the third data latch indicates an accumulated result of respective program operation failures of the first memory cell and the second memory cell.

8. The nonvolatile memory device as set forth in claim 5, further comprising a monitor circuit configured to monitor the third data latch and to stop the program verify operation when the stored data of the third data latch changes.

9. The nonvolatile memory device as set forth in claim 5, wherein the second page buffer further includes a cache latch configured to sequentially receive data from the second and third data latches through a dumping operation and to sequentially output data dumped from the second and third latches.

10. The nonvolatile memory device as set forth in claim 1, wherein the cell array includes a three-dimensional memory cell array.

11. A method of a program verify operation of a nonvolatile memory, the method comprising:
    storing first and second sensing data sensed from different memory cells in first and second page buffers according to a program verify operation, respectively;
    generating first verify data from the first sensing data in the first page buffer;

transmitting the second sensing data from the second page buffer to the first page buffer; and generating second verify data in the first page buffer by accumulating the transmitted second sensing data and the first verify data.

12. The program verify operation as set forth in claim 11, wherein generating the second verify data comprises:

dumping the transmitted second sensing data stored in a sensing latch of the first page buffer to a first data latch of the first page buffer;

storing data which is set according to logical values stored in a second data latch and the first data latch of the first page buffer in a third data latch of the first page buffer; and dumping data of the first data latch to the second data latch.

13. The program verify method as set forth in claim 12, wherein:

the stored data of the second data latch indicates whether a program operation of memory cells connected to the first page buffer or a memory cell connected to the second page buffer fails, and the stored data of the third data latch indicates an accumulated result of respective program operation failures of a memory cell connected to the first page buffer and a memory cell connected to the second page buffer.

14. The program verify method as set forth in claim 13, further comprising replacing a memory cell in which a program failure is detected with a redundant memory cell or processing a block comprising a memory cell in which a program failure is detected as a bad block, based on the stored data of the second and third data latch.

15. The program verify method as set forth in claim 11, further comprising outputting the second verify data after generating the second verify data is completed.

16. A method, executed by a page buffer circuit of a nonvolatile memory device (NVM), of detecting errors within memory cells of the NVM read by the page buffer circuit during a single program verify operation, the method comprising:

executing a first binary logic operation between: (1) a first data value sensed from a first memory cell by a first page buffer of the page buffer circuit during the program verify operation and (2) a second data value sensed from a second memory cell by a second page buffer of the page buffer circuit during the program verify operation; and determining the number of program errors existing among the first and second memory cells based upon the outcome of the first binary logic operation and the second data value.

17. The method of claim 16, wherein the first binary logic operation is a logical-OR operation.

18. The method of claim 16, further comprising:

copying, prior to executing the first binary logic operation, the second data value from a latch of the second page buffer to a first latch of the first page buffer;

executing the first binary logic operation by performing a logical-OR operation between the second data value stored in the first latch and the first value, which is stored in a second latch of the first page buffer; and storing the outcome of the first binary logic operation in a third latch of the first page buffer.

19. The method of claim 16, further comprising:

executing a second binary logic operation between the second data value and a third data value sensed from a third memory cell by a third page buffer of the page buffer circuit during the program verify operation; and determining the number of program errors existing among the first, second, and third memory cells based upon the outcome of the binary logic operation and the third data value.

20. The method of claim 19, wherein each of the first and second binary operations is a logical-OR operation.

* * * * *